US006795292B2

(12) United States Patent
Grimard et al.

(10) Patent No.: US 6,795,292 B2
(45) Date of Patent: Sep. 21, 2004

(54) APPARATUS FOR REGULATING TEMPERATURE OF A PROCESS KIT IN A SEMICONDUCTOR WAFER-PROCESSING CHAMBER

(76) Inventors: Dennis Grimard, 511 Liberty Point, Ann Arbor, MI (US) 48103; Arnold Kholodenko, 1747 Eucalyptus Dr., San Francisco, CA (US) 94132; Alex Veytser, 1429 Lloyd Way, Mountain View, CA (US) 94040; Senh Thach, 32257 Jean Dr., Union City, CA (US) 94587; Wing Cheng, 1665 Lachine Dr., Sunnyvale, CA (US) 94087

( * ) Notice: Subject to any disclaimer, the term of this patent is extended or adjusted under 35 U.S.C. 154(b) by 303 days.

(21) Appl. No.: 09/861,984

(22) Filed: May 15, 2001

(65) Prior Publication Data

US 2002/0171994 A1 Nov. 21, 2002

(51) Int. Cl.[7] .............................................. H01G 23/00
(52) U.S. Cl. ....................................................... 361/234
(58) Field of Search .......................... 361/234; 118/500, 118/501

(56) References Cited

U.S. PATENT DOCUMENTS

| 5,463,526 A | 10/1995 | Mundt .......................... 361/234 |
| 5,476,548 A | 12/1995 | Lei et al. ...................... 118/728 |
| 5,656,093 A | 8/1997 | Burkhart et al. ............. 118/728 |
| 6,151,203 A | 11/2000 | Shamouilian et al. ....... 361/234 |

FOREIGN PATENT DOCUMENTS

| EP | 0 843 023 | 5/1998 | ............ C23C/16/00 |
| WO | 00/42235 | 7/2000 | ............ C23C/16/44 |
| WO | 00/45427 | 8/2000 | ......... H01L/21/205 |

OTHER PUBLICATIONS

Parkhe et al. "Electrostatic Chuck Having Full Area Temperature Control" U.S. patent application Ser. No. 09/691, 655, filed Oct. 17, 2000.

*Primary Examiner*—Brian Sircus
*Assistant Examiner*—James A Demakis
(74) *Attorney, Agent, or Firm*—Moser, Patterson & Sheridan, NJ; Joseph Bach

(57) ABSTRACT

An apparatus for reducing by-product formation in a semiconductor wafer-processing chamber. In a first embodiment, the apparatus comprises a chuck having a chucking electrode and a radially extending peripheral flange. A collar is disposed over the peripheral flange defining a first gap therebetween, and circumscribes the chuck. A heater element is embedded within the collar and adapted for connection to a power source. In a second embodiment, the apparatus comprises a chuck having a chucking electrode and a radially extending peripheral flange, and a collar having a heater element embedded therein. The collar is disposed over the peripheral flange to define a gap therebetween, and circumscribes the chuck. Moreover, a pedestal having a gas delivery system therein is disposed below the chuck and collar. In a third embodiment, the apparatus comprises a chuck having a chucking electrode and a radially extending peripheral flange, a collar, and a waste ring having a heater element embedded therein. The waste ring is disposed over the peripheral flange defining a gap therebetween, and circumscribes the chuck. The collar is chucked to the waste ring, and the waste ring is chucked to a pedestal support. Moreover, the waste ring and pedestal each have a gas delivery system therein for regulating the temperature of the collar.

26 Claims, 4 Drawing Sheets

APPARATUS FOR REGULATING TEMPERATURE OF A PROCESS KIT IN A SEMICONDUCTOR WAFER-PROCESSING CHAMBER

BACKGROUND OF THE DISCLOSURE

1. Field of the Invention

The present invention is generally related to semiconductor wafer processing equipment and, more particularly, to an improved apparatus and method for controlling by-product formation and particle formation in a semiconductor wafer processing system.

2. Description of the Background Art

During semiconductor wafer processing, such as etching or deposition, unwanted particle formation may occur. For example, during a deposition process, undesirable by-products have been observed to result from the plasma itself. Alternatively, during an etching process, unmasked portions of a semiconductor wafer are etched by physical bombardment of ions from a plasma gas. Etching may occur through chemical reactions, illustratively occurring from concentrations of chlorine, fluorine, or a combination of both, reacting with the semiconductor wafer material. In either deposition or etching semiconductor wafer process, by-products from the plasma or substrate have been observed to condense and subsequently form a film on the surface areas of the various components in the processing chamber area.

One such component is a process kit that circumscribes a chuck assembly, which retains the wafer. The process kit includes one or more generally ring-shaped apparatus, commonly known as shadow rings, waste rings, or collars. Although an exhaust path in the chamber exists to eliminate by-products and exhaust gases, contaminating by-products have still been observed to form upon the process kit.

It has been observed that temperature control of the process kit is useful in managing film formation on the process kit. Utilizing, RF losses in the process kit may occur from the materials that the process kit is fabricated, therefore increasing the temperature of the process kit. In many instances, there are essentially no RF loses in the process kit. As such, the temperature of the process kit does not rise to a level that prevents condensation thereon. Furthermore, applying RF biasing to the process kit to generate plasma over the process kit does not allow direct control of the temperature of the process kit. In addition, ion bombardment may cause unwanted wear on the process kit, which also leads to undesired particle formation.

These unwanted by-products accumulate and cause numerous problems. One problem is that the deposits form a thick, highly stressed film that eventually flakes off the process kit surface into particles. The loose particles then become contaminants in the etching chamber, which may cause degrading characteristics to a wafer. For example, during an etching process, the unwanted particles act as a mask, which prevent the etch process from occurring beneath the particles. Furthermore, such contaminants may cause shorts between the etched traces of a wafer. In addition, such by-products and subsequent particle formation deteriorates the surface area of the process kit. Consequently, the life expectancy of the process kit is diminished, which increases the replacement costs.

Another problem is that deposition on the process kit surfaces adjacent to the wafer edge, as well as diffusion of etch products, are responsible for non-uniformity and drift of etch parameters across the wafer. The effect of deposition is a loss of a passivant at the wafer edge. A passivant is a material that deposits on the wafer during an etching process in order to protect the vertical profiles of the area of the wafer being etched. Therefore, a need exists in the art for an apparatus that actively and controllably prevents by-product formation on the process kit.

SUMMARY OF THE INVENTION

The disadvantages associated with the prior art are overcome by the present invention of an apparatus for controlling film formation about a periphery of a substrate. In particular, the apparatus is temperature regulated and reduces film formation about a periphery of a substrate during semiconductor wafer processing. In a first embodiment, the apparatus comprises a chuck having a chucking electrode and a radially extending peripheral flange. A collar is disposed over the peripheral flange defining a first gap therebetween, and circumscribes the chuck. Moreover, a heater element is embedded within the collar and adapted for connection to a power source.

In a second embodiment, the apparatus comprises a chuck having a chucking electrode and a radially extending peripheral flange, and a collar having a heating and chucking element embedded therein. The collar is disposed over the peripheral flange to define a gap therebetween, and circumscribes the chuck. Moreover, a pedestal having a gas delivery system therein is disposed below the chuck and collar.

In a third embodiment, the apparatus comprises a chuck having a chucking electrode and a radially extending peripheral flange, a collar, a pedestal, and a waste ring having a heating/chucking element embedded therein. The collar circumscribes the chuck, and is disposed over the peripheral flange and the waste ring. The waste ring is seated on the pedestal and comprises an electrode for chucking the collar to the waste ring, and chucking the waste ring to the pedestal. The waste ring and pedestal each have a gas delivery system for transferring heat from the bottom surface of the collar to the waste ring, as well as from the bottom surface of the waste ring to the pedestal.

Thus, the apparatus inventively provides the ability to controllably establish a surface temperature of the collar to prevent condensation and subsequently film formation thereon.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present invention relates to improvements to an apparatus for retaining and processing a semiconductor substrate during an etching or deposition process. Such substrate processing may be conducted (but not necessarily required) in a plasma-based environment. Specifically, the invention relates to a process kit (e.g., a collar), which is temperature controlled to prevent undesirable materials (i.e., contaminants) from accumulating onto the collar during the etching or deposition process.

Figure 1:
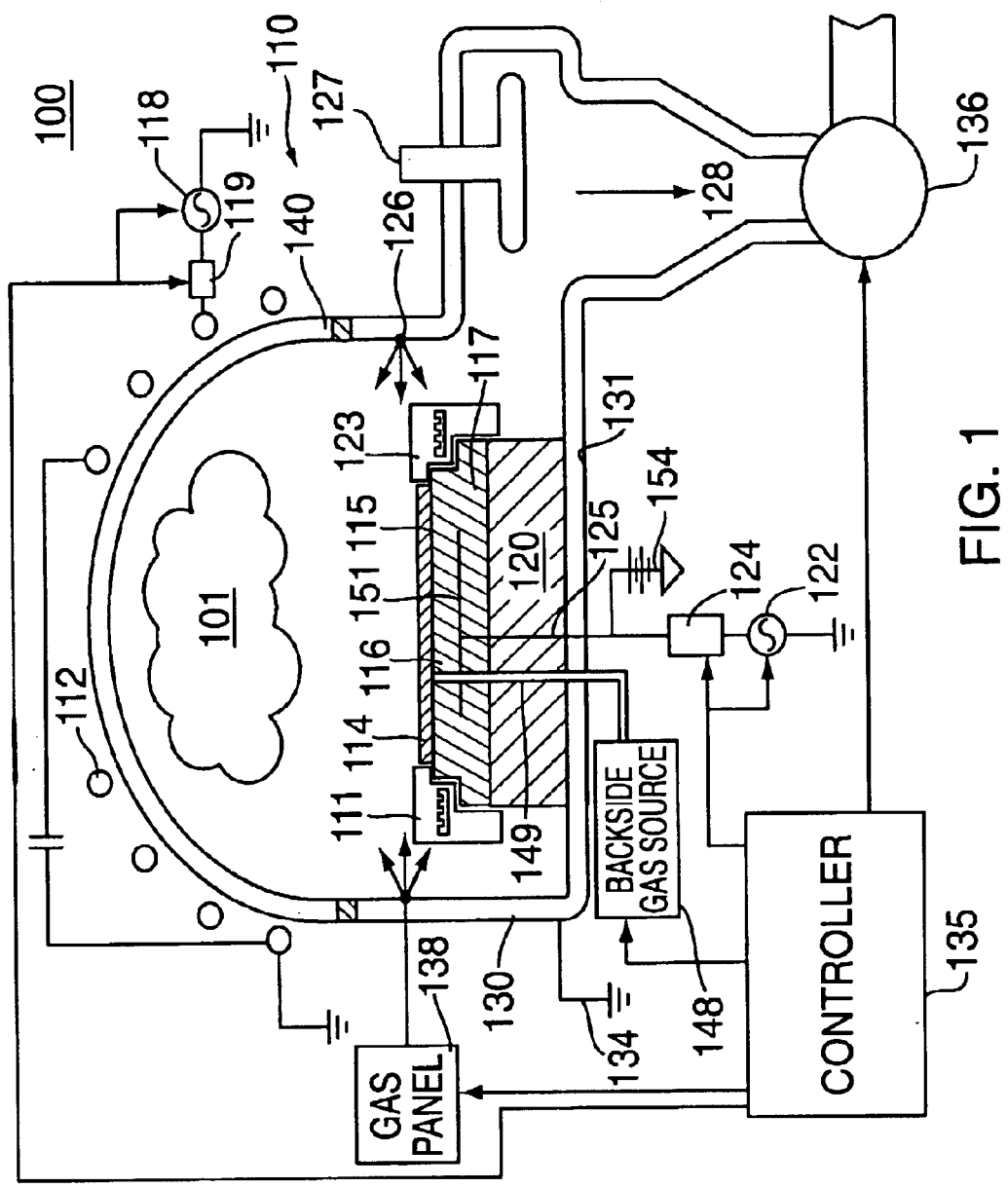
FIG. 1 depicts a schematic diagram of a plasma processing apparatus containing the present invention.

FIG. 1 depicts a simplified schematic diagram of a semiconductor substrate processing system 100. The system 100 is described in terms of a decoupled plasma source (DPS) etching chamber, manufactured and sold by Applied Materials, Inc. of Santa Clara, Calif. However, one skilled in the art will recognize that the inventive temperature controlled process kit may be incorporated into any other semiconductor wafer-processing chamber. Such chambers may illustratively include physical vapor deposition (PVD) chambers or chemical vapor deposition (CVD) chambers.

The system 100 comprises a processing chamber 110 that is defined by a plurality of walls 130 and a lid 140 disposed over the walls 130. The chamber walls 130 are fabricated from a durable, electrically conductive material such as aluminum. The walls 130 are grounded through ground connector 134 and serve as a ground reference (anode) for RF power. The lid 140 is dome-shaped and fabricated from a dielectric material such as quartz or $Al_2O_3$. At least one inductive coil antenna segment 112 is positioned exterior to the dome-shaped lid 140. The antenna segment 112 is connected to a first radio-frequency (RF) source 118. The RF source 118 is coupled to the antenna segment 112 through a matching network 119. The RF power applied to the inductive coil antenna 112 has a frequency between 50 kHz and 15 MHz, and preferably about 13.56 MHz. The power may vary from a few hundred watts to several thousand watts. In one embodiment of the invention, as illustratively practiced in a Deep Trench DPS chamber, the antenna power has a frequency of 13.56 MHz and produces power in a range of 300 to 2000 watts.

The process chamber 110 also includes a chuck 116 having a radially extending peripheral flange 117, and is seated upon a pedestal 120. The chuck 116 is typically fabricated from an insulating material. The insulating material may include a polymer such as polyimide or a ceramic material such as aluminum nitride. The chuck 116 may be removably attached via one or more fasteners (e.g., bolts (not shown)) or may be integral with the pedestal 120.

Although electrostatic chucks 116 vary in design, they are all based upon the principle of applying a fixed voltage to one or more electrodes 151 embedded in the chuck 116 to establish an electric field between the chuck 116 and the wafer 114. The electric field induces opposite polarity charges to accumulate on the wafer and the electrodes, respectively. The electrostatic attractive force between the oppositely polarized charges pulls the wafer toward the chuck 116, thereby retaining the wafer 114 upon the chuck 116. In a Coulombic type chuck, the magnitude of the retention force is directly proportional to the square of the potential difference between the wafer 114 and the chuck electrode 151.

In a Johnsen-Rahbek type chuck, where the chuck material has a finite resistivity and charges migrate from the electrodes to the chuck surface, the magnitude of the retention force is directly proportional to the square of the potential difference between the wafer 114 and the chuck surface 115. Specifically, in the Johnsen-Rahbek type chuck, the chuck 116 is fabricated from a finite resistivity material, e.g., aluminum nitride, which enables charges to migrate from the chuck electrodes 151 to the surface 115 of the chuck 116. Consequently, a small current flows through the wafer 114 at contact points between the chuck surface 115 and the wafer 114. This current flow, as expected, varies with the resistance of the wafer backside contact points to the chuck surface. For a detailed understanding of the Johnsen-Rahbek type of chuck, the reader is directed to the drawings and description in U.S. Pat. No. 5,463,526, issued Oct. 31, 1995, and authored by Mundt, which is hereby incorporated by reference herein as fully reproduced in its entirety.

In one embodiment, the substrate electrode 151 is fabricated from a mesh shaped conductive material suitable for semiconductor processing (e.g., molybdenum, tungsten, and the like). However, the substrate electrode 151 may also be formed as a coil or series of coils, or any shape or configuration that is suitable for providing chucking and bias power to the chuck 116. Alternately, the electrode 151 may be a bipolar electrode, where charges or opposite polarity form at each pole. A second power source 154 such as a DC power source is coupled to the substrate electrode 151, via a lead 125 passing through the pedestal 120 and bottom portion 131 of the chamber 110. The second (DC) power source 154 provides the voltage for chucking the wafer 114 to the surface of the chuck 116. In particular, the second power source 154 operates in a DC range of −4000V to +2000V and is utilized to retain (i.e., chuck) the wafer 114 via coulombic forces to the top surface of the chuck 116.

Furthermore, the substrate electrode 151 is coupled, via the substrate electrode lead 125, to a third (RF) power source 122 and a matching network 124 for controlling substrate biasing. The RF power source 122 operates in a RF range of $100V_{P-P}$ to $8000V_{P-P}$ and biases the wafer 114 to induce attraction and repulsion of ions in the plasma during an etching or deposition process. The bias power has an RF frequency range of 400 KHz to 15 MHz with a power of between 50 and 4000 watts.

A process kit 111 is disposed above the radially extending peripheral flange 117 of the chuck 116. The process kit 111 circumscribes the wafer 114 to improve process uniformity at the wafer edge. The pedestal 120 is affixed to a bottom portion 131 of a chamber 110. Additionally, the pedestal 120 is typically fabricated from a thermally conductive material such as aluminum, or a thermally less conductive material such as stainless steel. A workpiece 114 (i.e., a semiconductor wafer) is typically made of silicon. Additionally, a controller 135, which illustratively comprises a processor, (e.g., CPU), memory (e.g., RAM), and support circuits (not shown) is coupled to the various components of the processing chamber 110 to facilitate control of the wafer processing.

In operation, the wafer, i.e., semiconductor wafer 114 is placed on the chuck 116 and process gases are provided from a gas panel 138 to the process chamber 110 through entry ports 126 (e.g., gas nozzles, showerhead, and the like). The process gases are ignited in the process chamber 110 by applying RF power to the antenna 112 to form the plasma 101. RF power is also applied to the substrate electrode (cathode) 151 to bias the wafer 114 for enhanced processing. In particular, an electric field couples the electrode 151 to both the wafer 114 (and therefore the plasma 101) and the pedestal 120. The pedestal 120 and process kit 111 are fabricated from different materials than the wafer 114, and have different voltage potentials. As such, there is an abrupt change of plasma parameters and process uniformity at the wafer edge 123.

The pressure of the chamber 110 is controlled using a vacuum pump 136 connected to the chamber 110. A throttle valve 127, disposed proximate the pump 136, regulates the flow of exhaust gasses 128. Furthermore, the temperature of the chamber 110 may be regulated by using liquid-containing conduits (not shown) located in the walls 130 of the chamber 110.

Moreover, the wafer 114, chuck 116, and process kit 111 utilize heat transfer mediums, such as cooling fluids and gases to control their respective temperatures. In one embodiment, the temperature of the chuck 116 is regulated via cooling fluid channels (not shown) disposed in the chuck 116 or the pedestal 120. The cooling fluid channels are coupled to a supply line and return line from a cooling fluid source external to the chamber to form a closed cooling system. A cooling fluid (e.g., water) serves as the heat transfer medium while circulating through the fluid channels. For a detailed understanding of the cooling fluid channels and temperature control for a chuck 116, the reader is directed to the drawings and the description in commonly assigned U.S. Application titled "Electrostatic Chuck Having Full Area Temperature Control", authored by Parkhe et al., Docket No. 4562/ISM/COPPER/DV, filed Oct. 17, 2000, and incorporated herein by reference.

In addition, temperature control of the wafer 114 is provided via a backside gas such as helium. The backside gas flows from a backside gas source 148 via a backside gas conduit 149 extending through the pedestal 120 and chuck 116, to channels (not shown) formed on the surface 115 of the chuck 116. The backside of the wafer 114 is disposed over the channels, and the backside gas facilitates heat transfer between the wafer 114 and the support surface 116. For a detailed understanding of a backside gas delivery system for a chuck 116, the reader is directed to the drawings and the description in commonly assigned U.S. Pat. No. 5,476,548, issued Dec. 19, 1995, authored by Lei et al., and incorporated herein by reference.

Figure 2:
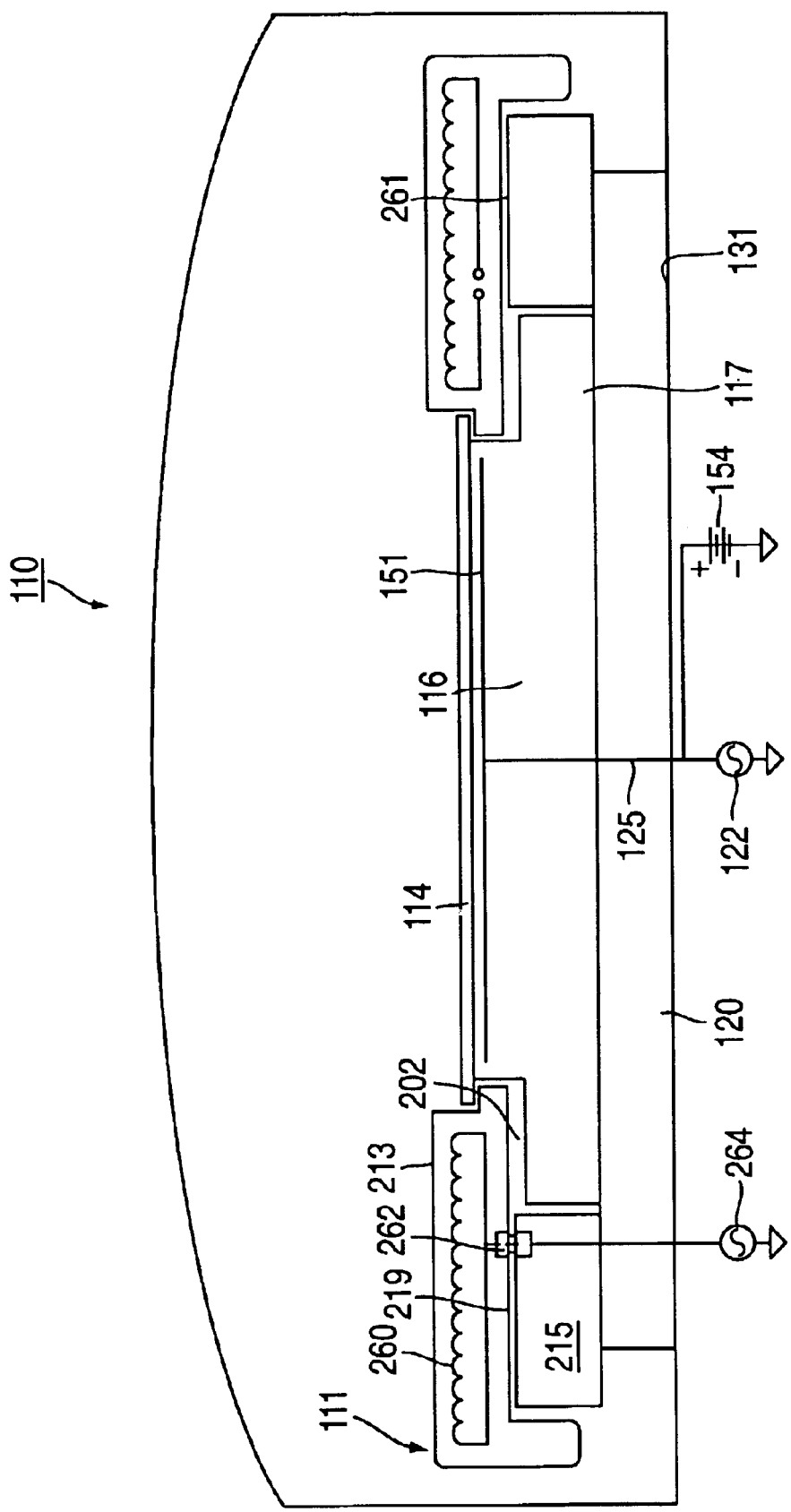
FIG. 2 depicts a detailed view of a first embodiment of a process kit of the present invention.

FIG. 2 depicts a detailed view of a first embodiment of a process kit 111 of the present invention. The process kit 111 comprises the collar 213 and a waste ring 215. The waste ring 215 is made of a thermally conductive material such as aluminum nitride, beryllium oxide, silicon, silicon carbide, or aluminum. The waste ring 215 is seated upon the pedestal 120 and circumscribes the radially extending peripheral flange 117 of the chuck 116. The collar 213 is disposed above the radially extended peripheral flange 117 of the chuck 116 to center and retain the wafer 114, as well as improve process uniformity at the wafer edge. In particular, the collar 213 is disposed over the waste ring 215, such that a first gap 202 is defined between the flange 117 and collar 213, and a second gap 261 is defined between the collar 213 and waste ring 215. Alternately, the collar 213 may be seated on the waste ring 215 without defining such second gap 261.

The collar 213 is generally one or more ring-shaped apparatus. The conduction of heat by the collar 213 is dependent upon the materials the collar 213 is fabricated from.

Preferably the collar 213 is fabricated from a thermally insulating and electrically insulating material such as aluminum oxide ($Al_2O_3$) or quartz. Alternately, the collar 213 may be fabricated from an electrically insulating, yet thermally conductive material such as aluminum nitride (AlN), or an electrically conductive and thermally conductive material such as silicon or SiC.

The collar 213 further comprises the heater element 260 (e.g. an electrode) embedded therein. Specifically, the heating element 260 is coupled to a fourth power supply 264 such as an AC power supply or a DC power supply. In one embodiment, the fourth power source 264 is a 60 Hz AC power source, which is external to the chamber 110 and operates in a range of $100V_{P-P}$ to $1000V_{P-P}$. Furthermore, the heater element 260 is a mesh fabricated from a conductive material (e.g., molybdenum, tungsten, or nickel) suitable for heating. Alternatively, the heater element 260 may be a coil or any other configuration suitable for maximizing the transfer of heat to the collar 213. The heater element 260 heats the collar 213 directly without any thermal losses through the chuck 116 and radially extending peripheral flange 117, since the gap 202 is defined between the collar 213 and chuck 116.

A high temperature RF compatible connector 262 is disposed through the waste ring 215 and couples the heater element 260 to the external fourth AC power source 264. In addition, the RF compatible connector 262 readily allows removal of the collar 213 for maintenance, replacement, or the like. In the preferred embodiment, the connector 262 is an electrically conductive and thermally insulative type of connector preferably fabricated from stainless steel. Furthermore, the RF connector 262 may be plated for RF conduction to eliminate RF losses in the connector itself with a conductive metal such as gold. The connector 262 is disposed through an insulator (not shown), which is thermally conductive and electrically insulating. For a detailed understanding of one such type of connector, the reader is directed to the drawings and description disclosed in U.S. Pat. No. 6,151,203 entitled "Connectors for an Electrostatic Chuck and Combination Thereof", by Shamouilian et al., issued Nov. 21, 2000, and assigned to the same assignee as the present application, Applied Materials, Inc., of Santa Clara, Calif. This patent is hereby incorporated by reference herein as if fully reproduced in its entirety.

The fourth power source 264 indirectly controls the temperature of the collar 213 by directly controlling the amount of current that flows through the heater element 260. The fourth power source 264 is capable of providing 100W to 2000W of power to the heater element 260. Increasing the current to the heater element 260 raises the temperature of the collar 213. By heating the heater element 260, subsequent formation of by-products on the surface of the collar 213 is prevented during either the etching or deposition processes.

Alternatively, decreasing the current through the heater element 260 decreases the temperature of the collar 213. Furthermore, the waste ring 215 and pedestal 120 function as a thermally conductive path (i.e., heat sink). The thermally conductive path flows from the heater element 260 through a lower surface 219 of the collar 213, through the waste ring 215, and to the pedestal 120.

Figure 3:
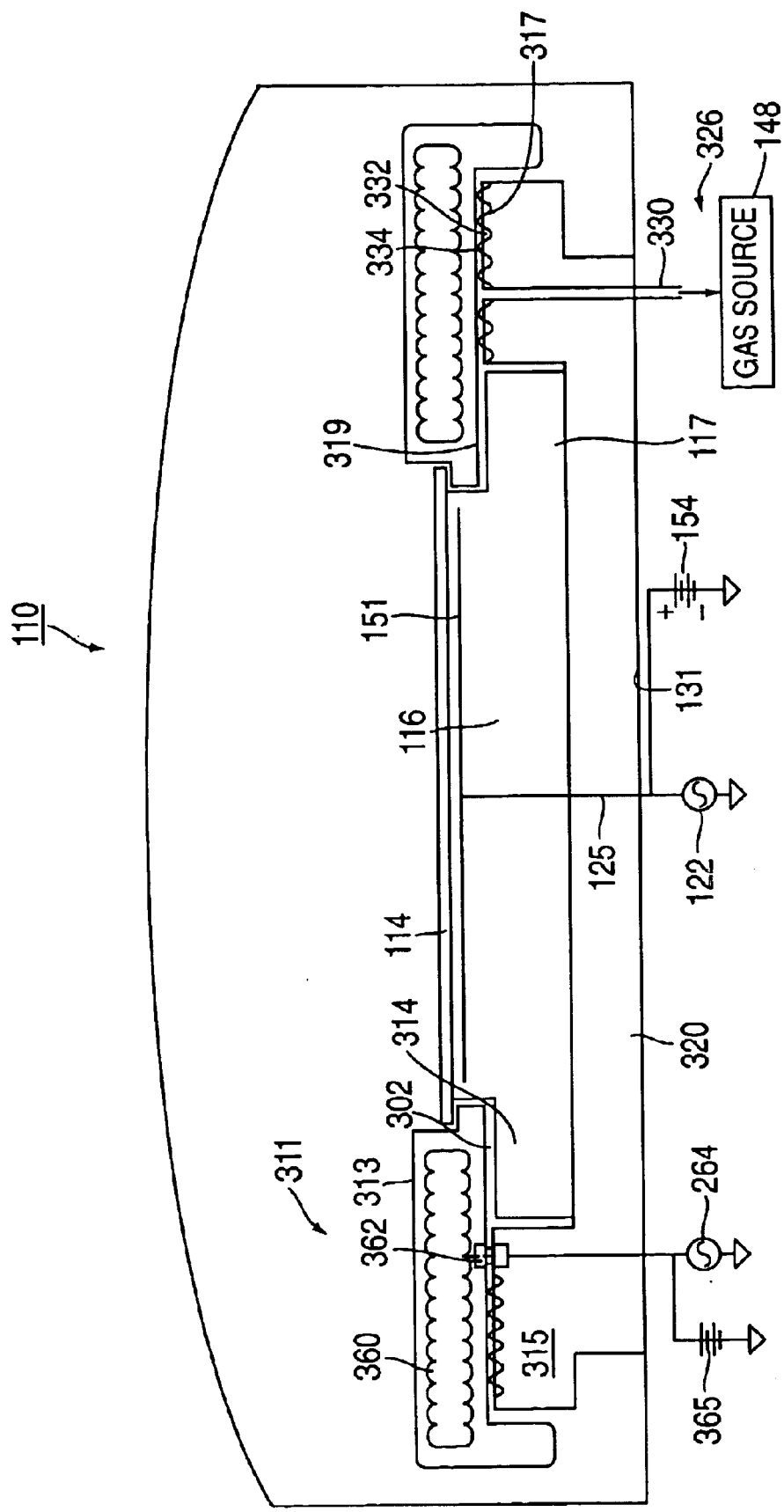
FIG. 3 depicts a detailed view of a second embodiment of a process kit of the present invention.

FIG. 3 depicts a detailed view of a second embodiment of a process kit 311 of the present invention for improved temperature control. Quickly cooling the heater element, and hence the collar allows for subsequent wafers to be processed to be placed upon the chuck surface at a faster rate, which increases overall wafer throughput. Additionally, actively controlling the heating and cooling of the collar provides uniform temperature conditions during each subsequent wafer processing operation, thereby producing uniform lots of wafers.

The process kit 311 comprises the collar 313 having the heater element 360 embedded therein. The collar 313 is disposed above the radially extended peripheral flange 117 of the chuck 116. However, in this second embodiment, the collar 313 is seated directly upon the pedestal 320. In particular, the pedestal 320 further comprises an upward extending flange 315, which forms a bucket shaped pedestal 320. The pedestal flange 315 circumscribes the radially extending flange 117 of the chuck 116. The collar 313 is seated on an upper surface 317 of the pedestal flange 315. Furthermore, the pedestal flange 315 has a height greater than the peripheral flange 117 of the chuck 116, thereby defining a gap 302 between a lower surface of the collar 313 and a top surface of the peripheral flange 117. In this manner, a conductive thermal path is averted between the collar 313 and the chuck 116.

A DC power source 365 is coupled in parallel to the AC power supply 264 to "chuck" the collar 313 to the upper surface 317 of the pedestal flange 315. In particular, the DC power source 365 provides a chucking voltage to the heater electrode 360 embedded in the collar 313. In one embodiment where the collar is fabricated from a semi-conducting material (e.g., aluminum nitride), the Johnsen-Rahbek type of chucking occurs between the collar 313 and the pedestal flange 315 in a similar manner as between the chuck 116 and wafer 114 as discussed above. Specifically, charges (e.g. positive charges) form on the lower surface 319 of the collar 313, which attract opposite polarity charges on the upper surface 317 of the pedestal flange 315. The Coulombic force between the charges of opposite polarity retains the lower surface of the collar 313 to the upper surface 317 of the pedestal flange 315. Alternately chucking the collar 313 to the pedestal flange 315 may be achieved via the Coulombic type of chucking as between the heater electrode 360 and the pedestal flange 315. As such, the heater electrode 360 is positioned close to the surface of the area of the collar 313 to maximize the Coulombic forces, as opposed to being positioned further away (e.g., in the center of the collar). The remaining components and interrelationships of the second embodiment of FIG. 3 are the same as those depicted in the first embodiment of FIG. 2.

In addition, a gas delivery system 326 is disposed in the pedestal flange 315. The gas delivery system 326 comprises one or more backside gas conduits 330, which traverse through the pedestal flange 315 from the gas source 148 external to the chamber 110, to the upper surface 317 of the pedestal flange 315. Disposed on the upper surface 317 of the pedestal flange 315 is a plurality of channels 332. The plurality of channels 332 formed on the upper surface 317 extend radially outward from the one or more gas conduits 330. A heat transfer gas, such as helium, is provided from the gas source 148 to the plurality of channels 332, via the one or more gas conduits 330. The heat transfer gas conducts heat from the lower surface 319 of the collar 313 to the upper surface 317 of the pedestal flange 315. The heat from the upper surface 317 is then radially conducted from the pedestal flange 315 to the pedestal 320, which together serve as a heat sink to remove heat away from the collar 313.

Alternately, a plurality of mesas 334 is disposed on the upper surface 317 of the pedestal flange 315. The plurality of mesas 334 is a plurality of protrusions, which are formed, illustratively, by a deposition process or machining process on the upper surface 317 of the pedestal flange 315. The plurality of mesas 334 has a predefined thickness and height, which maintains a workpiece (e.g., collar 313) above the upper surface 317 of the pedestal flange 315. For a detailed understanding of the plurality of mesas 334, the reader is directed to the drawings and the description in commonly assigned U.S. Pat. No. 5,656,093, issued Aug. 12, 1997, authored by Burkhart et al., and incorporated herein by reference in its entirety. Burkhart et al. teaches a spacing mask formed by depositing a metallic material in a predefined pattern over a surface.

The plurality of mesas 334 may either supplement or replace the plurality of channels 332. In particular, the lower surface 319 of the collar 313 is seated (e.g., chucked) on the plurality of mesas 334. Consequently, the heat transfer gas from the gas conduit 330 is dispersed around the plurality of mesas 334 between the lower surface 319 of the collar and the upper surface 317 of the pedestal flange 315. As discussed previously, the heat transfer gas conducts the heat from the lower surface of the collar 313 to the upper surface of the flange 315, whereupon the heat is radially transferred to the pedestal 320.

As such, temperature regulation of the collar 313 in this second embodiment is provided by multiple techniques. First, the fourth power supply 264 indirectly controls the temperature of the collar 313 by directly controlling the amount of power (i.e., current) that flows through the heater element 360. Increasing the current to the heater element 360 raises the temperature of the collar 313, while decreasing the current through the heater element 360 decreases the temperature of the collar 313. By increasing the temperature of the collar 313, condensation on the surface of the collar 313 is reduced, which minimizes by-product and subsequent film accumulation thereon.

Quickly reducing the heat from the chuck 116 and the collar 313 is preferable after completion of the etching or deposition process. As such, uniform thermal conditions during each subsequent wafer process may be achieved, as well as an overall increase in wafer throughput. Removing heat from the collar 313 may also be accomplished through various heat transfer paths.

In this second embodiment, the pedestal flange 315 and pedestal 320 serve as a thermally conductive path to conduct heat away from the collar 313 without detrimentally increasing the temperature of the chuck 116. Specifically, the lower surface 319 of the collar 313 interfaces with the upper surface 317 of the pedestal flange 315, which is either coupled to or integral with the pedestal 320. A person skilled in the art will recognize that the amount of contact surface area between the collar 313 and the pedestal flange 315, as well as the pedestal flange 315 and pedestal 320 influences the rate of heat that may be transferred through such thermally conductive path. In addition, the gas conduit 330 provides the backside helium gas through the plurality of channels 332 and/or plurality of mesas 334 to transfer heat from the collar 313 to the pedestal flange 315, and subsequently to the pedestal 320.

Thus, the second embodiment actively controls temperature regulation to the collar 313, as opposed to simply radiating into the chamber and/or conducting the heat along the thermally conductive path (i.e., pedestal flange 315 and pedestal 320). Specifically, temperature control of the collar 313 may be quickly achieved by increasing the current to the heater element 360. Similarly, reducing the chucking forces, and/or increasing the helium gas pressure of the area between the collar 313 and pedestal flange 315 quickly lowers or raises the temperature of the collar 313, as compared to simply radiating heat therefrom.

Figure 4:
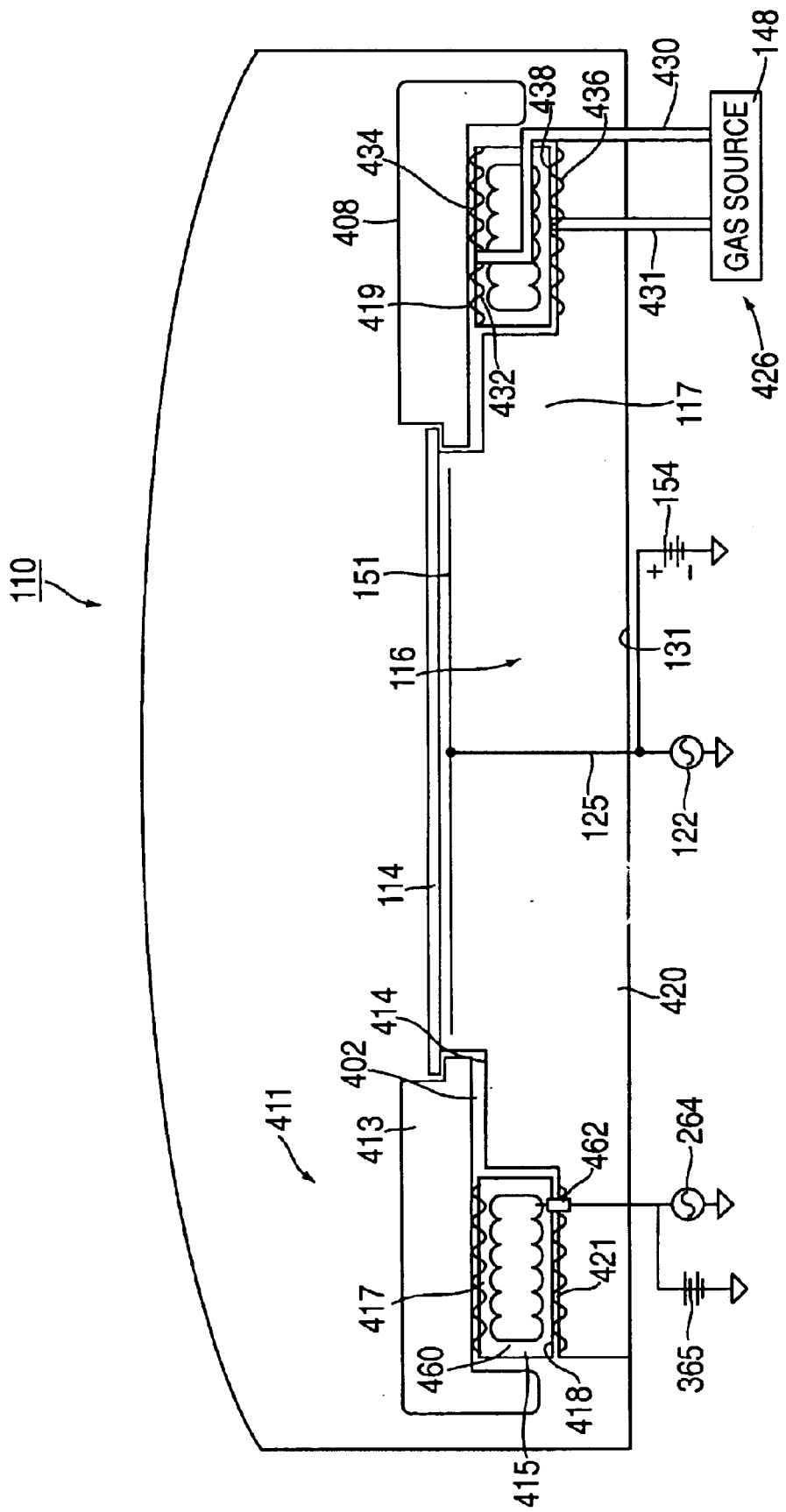
FIG. 4 depicts a detailed view of a third embodiment of a process kit of the present invention.

FIG. 4 depicts a detailed view of a third embodiment of a process kit 411 of the present invention. The process kit 411 comprises a collar 413 and waste ring 415 disposed above the radially extended peripheral flange 117 of the chuck 116. The collar 413 and waste ring 415 are preferably fabricated from the thermally conductive and electrically conductive materials as discussed in the embodiment of FIG. 2. In particular, the collar 413 and waste ring 415 are preferably fabricated from silicon or SiC, and aluminum nitride respectively. However, in this third embodiment, the collar 413 is seated directly upon a waste ring 415, as opposed to having the gap 261 therebetween as in the first embodiment of FIG. 2. Specifically, a lower surface 418 of the waste ring 415 is seated upon an upper surface 421 of the pedestal 420, and circumscribes the radially extending peripheral flange 117 of the chuck 116. The lower surface 419 of the collar 413 is then seated on an upper surface 417 of the waste ring 415, such that the collar is disposed above the radially extended peripheral flange 117 of the chuck 116. Furthermore, the waste ring 415 has a height greater than the peripheral flange 117 of the chuck 116 to define a gap 402 between a lower surface 419 of the collar 413 and an upper surface 414 of the peripheral flange 117. In this manner, a thermally conductive path is averted as between the collar 413 and the chuck 116.

The waste ring 415 further comprises the heater element 460 embedded therein. However, in this third embodiment, the heater element 460 also functions as a chucking electrode. In particular, the heater element 460 is positioned near the upper surface 417 and the lower surface 418 of the waste ring 415. The heating element 460 is coupled to the external fourth power supply 264 such as the 60 Hz AC power supply that provides power in a range of 100 watts to 2000 watts. The heating element 460 is coupled to a fourth power supply 264 via the high temperature connector 462 that is disposed through the pedestal 120 and waste ring 415. The RF connector 462 is disposed in an insulator (not shown) as described in the first embodiment of FIG. 2, and readily permits removal of the waste ring 415 for maintenance, replacement, or the like.

In the preferred embodiment, the heater element 460 is a mesh fabricated from a conductive material (e.g., molybdenum, tungsten, or nickel) suitable for heating and chucking. Alternatively, the heater element 460 may be coil or the like. The heater element 460 heats the collar 413 via the waste ring 415 with lower thermal losses through chuck 116 and radially extending peripheral flange 117. In particular, the height of the waste ring 415 is greater than the height of the peripheral flange 117, thereby defining a gap 402 between the lower surface 419 of the collar 413 and the upper surface 414 of the peripheral flange 117. The remaining components and interrelationships of the third embodiment of FIG. 4 are the same as those depicted in the first embodiment of FIG. 2.

In this third embodiment, the DC power source 365 may also be coupled in parallel to the AC power supply 264 to "chuck" the collar 413 to an upper surface 417 of the waste ring 415. In particular, the DC power source 365 provides a chucking voltage to the heater element (electrode) 460 in the waste ring 415. In an instance where the collar 413 and waste ring 415 are illustratively fabricated from a semi-conductive material such as aluminum nitride, charges (e.g. positive charges) form on the upper surface 417 of the waste ring 415 when the DC power source 365 is activated. The charges attract opposite polarity (e.g., negative) charges on the lower surface 419 of the collar 413 in the manner described for a Johnsen-Rahbek type of chuck. The Coulombic force between the charges of opposite polarity retains the collar 413 on the upper surface 417 of the waste ring 415. Furthermore, the DC power source 365 also provides a voltage to chuck the waste ring 415 to the pedestal 420. As such, the same Johnsen-Rahbek type of chucking occurs between the lower surface 418 of the waste ring 415 and the upper surface 421 of the pedestal 420.

In addition, a gas delivery system 426 is disposed in the waste ring 415. The gas delivery system 426 comprises one or more backside gas conduits 430, which traverse through the waste ring 415 from the gas source 148, to the upper surface 417 of the waste ring 415. Disposed on the upper surface 417 of the waste ring 415 is a plurality of channels 432, which extend radially outward from the one or more gas conduits 430. Moreover, one or more backside gas conduits 431 traverse through the pedestal 420 from the gas source 148, to the upper surface 421 of the pedestal 420. Disposed on the upper surface 421 of the pedestal 420 is a plurality of channels 436, which extend radially outward from the one or more gas conduits 431.

The heat transfer gas (e.g., helium) is provided to the plurality of channels 432 in the waste ring 415, as well as the plurality of channels 436 in the pedestal 420. In particular, the heat transfer gas is provided from the gas source 148, via the gas conduits 430 and 431 respectively. The heat transfer gas (e.g., helium) provided by the plurality of channels 432 in the waste ring 415 conducts heat from the lower surface 419 of the collar 413 and transfers the heat to the upper surface 417 of the waste ring 415. Similarly, the heat transfer gas (e.g., helium) provided by the plurality of channels 436 in the pedestal 420 conducts heat from the lower surface 418 of the waste ring 415 and transfers the heat to the upper surface 421 of the pedestal 420.

In addition, a first plurality of mesas 434 may be disposed on the upper surface 417 of the waste ring 415 in a similar manner as shown in the second embodiment of FIG. 3. As such, the lower surface 419 of the collar 413 is seated (e.g., chucked) on the first plurality of mesas 434. In a similar manner, a second plurality of mesas 438 may also be disposed on the upper surface 421 of the pedestal 420. Accordingly, the lower surface 418 of the waste ring 415 is seated (e.g., chucked) on the second plurality of mesas 438. Consequently, the heat transfer gas from the gas conduit 430 is dispersed around the first plurality of mesas 434 between the lower surface 419 of the collar 413 and the upper surface 417 of the waste ring 415. Likewise, the heat transfer gas from the gas conduit 431 is dispersed around the second plurality of mesas 438 between the lower surface 418 of the waste ring 415 and the upper surface 421 of the pedestal 420.

As such, temperature regulation of the collar 413 in this third embodiment is provided by multiple techniques. First, the fourth power supply 264 indirectly controls the temperature of the collar 413 by directly controlling the amount of power (i.e., current) that flows through the heater element 460 in the waste ring 415. Increasing the current to the heater element 460 raises the temperature of the waste ring 415. In this manner, by-products, and subsequently film formation on the collar 413 is reduced. Alternately, decreasing the current through the heater element 460 in the waste ring 415 decreases the temperature of the collar 413. Similarly, by actively increasing the chucking forces, and/or increasing the helium gas pressure of the area between the collar 413, waste ring 415, and pedestal 420, the temperature of the collar 413 is quickly lowered, as compared to simply radiating the heat therefrom.

Quickly reducing the heat to the chuck 116 and the chamber 110 is preferable after completion of the etching or deposition process to maximize wafer-processing throughput. A person skilled in the art will recognize that the amount of contact surface area between the collar 413 and the waste ring 415, as well as the waste ring 415 and pedestal 420 influences the rate of heat that may be transferred through this thermally conductive path. Furthermore, the backside helium gas provided through the plurality of channels 432 and 436 (and/or plurality of mesas 434 and 438) increases the rate of heat transfer as between the collar 413 to the waste ring 415, as well as between the waste ring 415 and pedestal 420. Maintaining the same temperature (thermal conditions) at the start of each wafer process also provides uniform processing characteristics, which results in consistent processing and wafer output.

The inventive process kits as illustrated in the three embodiments are actively heated to increase the surface temperature of the collar. In this manner, the increased temperature of the collar surface area reduces by-product condensation thereon during an etching or deposition process. Moreover, a reduction in by-product formation on the process kit provides improved etching or deposition uniformity across the entire wafer during processing.

In particular, a temperature gradient may exist between the center and periphery of the wafer. Actively controlling the temperature of the collar by either quickly increasing or decreasing its temperature as described in the embodiments herein minimizes temperature gradients, thereby providing a more uniform etch or deposition process across the surface of the wafer.

Although several preferred embodiments that incorporate the teachings of the present invention have been shown and described in detail, those skilled in the art can readily devise many other varied embodiments that still incorporate these teachings.

What is claimed is:

1. An apparatus for reducing by-product formation in a semiconductor wafer-processing chamber, comprising:
   a chuck having a chucking electrode and a radially extending peripheral flange;
   a collar circumscribing said chuck, and disposed over said peripheral flange and defining a gap therebetween; and
   a heater element embedded within said collar and adapted for connection to a power source.

2. The apparatus of claim 1 wherein said chuck and peripheral flange are seated on a pedestal.

3. The apparatus of claim 2, further comprising a waste ring disposed below said collar.

4. The apparatus of claim 3 wherein said waste ring is seated on said pedestal and circumscribes said peripheral flange of said chuck.

5. The apparatus of claim 4 wherein a gap is defined between the collar and the waste ring.

6. The apparatus of claim 4 wherein said collar is seated on an upper surface of said waste ring.

7. The apparatus of claim 6 wherein said collar is electrostatically retained to said upper surface of said waste ring.

8. The apparatus of claim 2 wherein said pedestal further comprises a pedestal flange.

9. The apparatus of claim 8 wherein said collar is electrostatically retained to the pedestal flange.

10. The apparatus of claim 9 wherein said pedestal flange further comprises an upper surface having a plurality of channels disposed thereon, a gas conduit communicating with said plurality of channels and adapted for connection to a gas source.

11. The apparatus of claim 9 wherein said pedestal flange further comprises an upper surface having a plurality of mesas disposed thereon, a gas conduit extending to said upper surface.

12. The apparatus of claim 3 wherein said collar is detachable from said waste ring.

13. The apparatus of claim 1 wherein the collar is fabricated from a material selected from the group comprising $Al_2O_3$, quartz, aluminum nitride, silicon, and SiC.

14. The apparatus of claim 2 wherein said pedestal is fabricated from a material selected from the group comprising stainless steel and aluminum.

15. The apparatus of claim 3 wherein the waste ring is fabricated from a material selected from the group comprising aluminum nitride, beryllium oxide, silicon, SiC, or aluminum.

16. An apparatus for reducing by-product formation in a semiconductor wafer processing chamber, comprising:
   a pedestal;
   a chuck having a chucking electrode and a radially extending peripheral flange, said chuck seated on said pedestal;
   a waste ring having a heater element disposed therein, said waste ring circumscribing said peripheral flange and seated on said pedestal; and
   a collar seated on said waste ring and circumscribing said chuck.

17. The apparatus of claim 16 wherein said collar is electrostatically retained upon said waste ring.

18. The apparatus of claim 16 wherein said waste ring is electrostatically retained to said pedestal.

19. The apparatus of claim 16 wherein said waste ring further comprises a gas delivery system.

20. The apparatus of claim 19 wherein said gas delivery system comprises:
   a first gas conduit extending though said waste ring and adapted for connection to a gas source; and
   a first plurality of channels formed in an upper surface of said waste ring and radially extending from said gas conduit.

21. The apparatus of claim 20 wherein said gas delivery system further comprises:
   a second gas conduit extending though said pedestal and adapted for connection to said gas source; and
   a second plurality of channels formed in an upper surface of said pedestal and radially extending from said gas conduit.

22. The apparatus of claim 19 wherein said gas delivery system comprises:
   a first gas conduit extending though said waste ring and adapted for connection to a gas source; and
   a first plurality of mesas formed in an upper surface of said waste ring and radially extending from said gas conduit.

23. The apparatus of claim 22 wherein said gas delivery system further comprises:
   a second gas conduit extending though said pedestal and adapted for connection to said gas source; and
   a second plurality of mesas formed in an upper surface of said pedestal and radially extending from said gas conduit.

24. The apparatus of claim 16 wherein the collar is fabricated from a material selected from the group comprising $Al_2O_3$, quartz, aluminum nitride, silicon, and SiC.

25. The apparatus of claim 16 wherein said pedestal is fabricated from a material selected from the group comprising stainless steel and aluminum.

26. The apparatus of claim 16 wherein the waste ring is fabricated from a material selected from the group comprising aluminum nitride, beryllium oxide, silicon, SiC, or aluminum.

* * * * *